United States Patent
Jena et al.

(10) Patent No.: US 12,325,635 B2
(45) Date of Patent: Jun. 10, 2025

(54) METALLIC AND MAGNETIC CARBON MATERIAL

(71) Applicants: VIRGINIA COMMONWEALTH UNIVERSITY, Richmond, VA (US); UNIVERSITY OF MASSACHUSETTS, Boston, MA (US)

(72) Inventors: Puru Jena, Richmond, VA (US); Hong Fang, Camden, NJ (US); Joel Therrien, Boston, MA (US)

(73) Assignee: Virginia Commonwealth University, Richmond, VA (US)

( * ) Notice: Subject to any disclaimer, the term of this patent is extended or adjusted under 35 U.S.C. 154(b) by 692 days.

(21) Appl. No.: 17/625,511

(22) PCT Filed: Jul. 9, 2020

(86) PCT No.: PCT/US2020/041376
§ 371 (c)(1),
(2) Date: Jan. 7, 2022

(87) PCT Pub. No.: WO2021/007417
PCT Pub. Date: Jan. 14, 2021

(65) Prior Publication Data
US 2022/0274834 A1     Sep. 1, 2022

Related U.S. Application Data

(60) Provisional application No. 62/979,975, filed on Feb. 21, 2020, provisional application No. 62/896,827, (Continued)

(51) Int. Cl.
    *C01B 32/05*       (2017.01)
    *B01J 23/50*       (2006.01)
(Continued)

(52) U.S. Cl.
CPC .............. *C01B 32/05* (2017.08); *B01J 23/50* (2013.01); *B01J 23/52* (2013.01); *B01J 23/72* (2013.01);
(Continued)

(58) Field of Classification Search
CPC ... C01B 32/182; C01B 32/184; C01B 32/186; C01B 32/188; C01B 32/19;
(Continued)

(56) References Cited

U.S. PATENT DOCUMENTS

| | | | | |
|---|---|---|---|---|
| 4,845,533 A | * | 7/1989 | Pryor | H10N 70/026 257/4 |
| 2007/0158618 A1 | * | 7/2007 | Song | H01M 8/0223 252/500 |
| 2008/0260968 A1 | * | 10/2008 | Kim | C23C 16/45512 427/249.1 |

OTHER PUBLICATIONS

Kenneth M. Merz, Jr., Roald Hoffmann, and Alexandru T. Balaban, 3,4-Connected Carbon Nets: Through-Space and Through-Bond Interactions in the Solid State, Jan. 20, 1987, J. Am. Chem. Soc., 109, 6742-6751 (Year: 1987).*

* cited by examiner

*Primary Examiner* — Daniel C. McCracken
*Assistant Examiner* — Joshua Maxwell Speer
(74) *Attorney, Agent, or Firm* — WCF IP

(57) ABSTRACT

A 3-dimensional crystalline carbon material that is magnetic and metallic under ambient conditions is provided. The material, denominated U-carbon, has been synthesized using the molecular precursor, 3, 3-dimethyl-1-butene ($C_6H_{12}$). Depending on the atomic connections made between the carbon atoms of the material, U-Carbon forms structures that exhibit semiconducting and nonmagnetic to metallic and ferromagnetic behaviors. The use of selected molecular precursors (such as 3, 3-dimethyl-1-butene $C_6H_{12}$) that
(Continued)

support crystal growth based on clustered rather than individual atoms is a paradigm shift in materials development. Rationally designed metastable materials with desirable properties, including U-Carbon, can have many scientific and technological applications.

8 Claims, 12 Drawing Sheets

Related U.S. Application Data filed on Sep. 6, 2019, provisional application No. 62/872,267, filed on Jul. 10, 2019.

(51) Int. Cl.
*B01J 23/52* (2006.01)
*B01J 23/72* (2006.01)
*B01J 23/755* (2006.01)
*B01J 27/24* (2006.01)
*B01J 37/02* (2006.01)
*C23C 16/26* (2006.01)

(52) U.S. Cl.
CPC ............. *B01J 23/755* (2013.01); *B01J 27/24* (2013.01); *B01J 37/0215* (2013.01); *C23C 16/26* (2013.01); *C01P 2006/40* (2013.01); *C01P 2006/42* (2013.01)

(58) Field of Classification Search
CPC ... C01B 32/192; C01B 32/194; C01B 32/196; C01B 32/198; C01B 2204/00; C01B 2204/02; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32; C01B 32/20; C01B 32/205; C01B 32/21; C01B 32/215; C01B 32/22; C01B 32/225; C01B 32/23
See application file for complete search history.

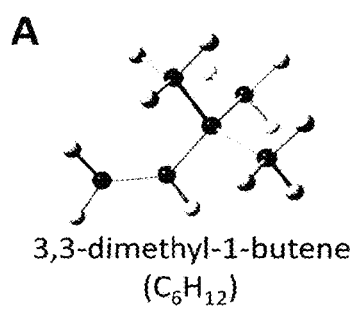
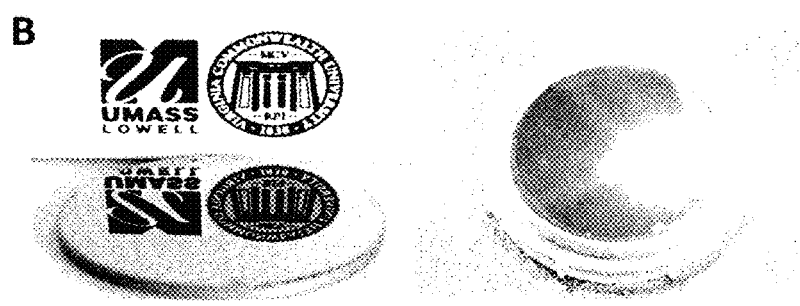
FIG. 1A
FIG. 1B

Figure 4A
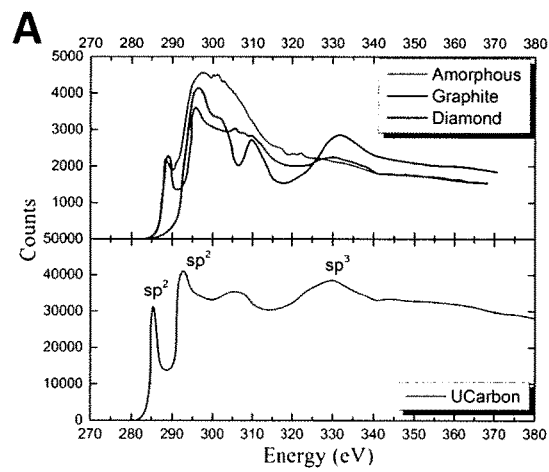
Figure 4B
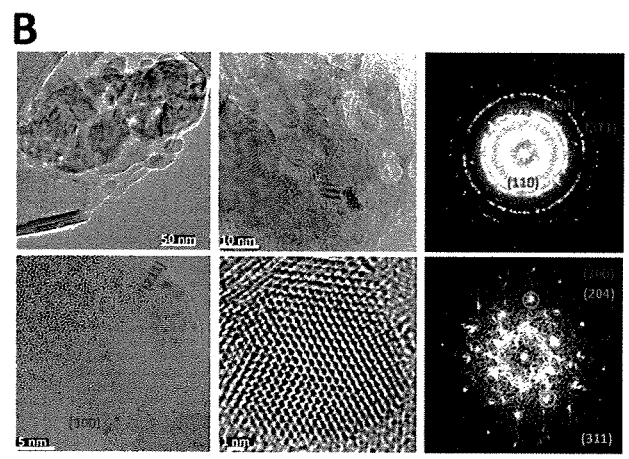
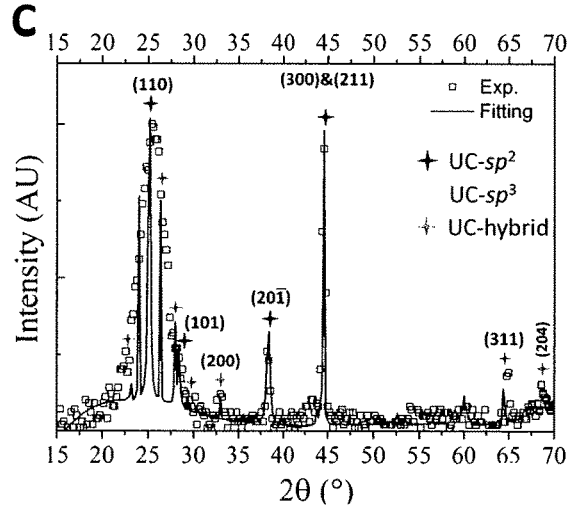
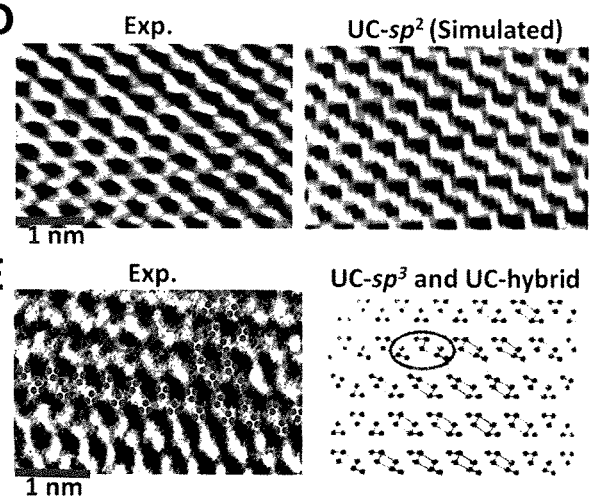
Figure 4C
Figure 4D
Figure 4E Figure 6A  Figure 6B
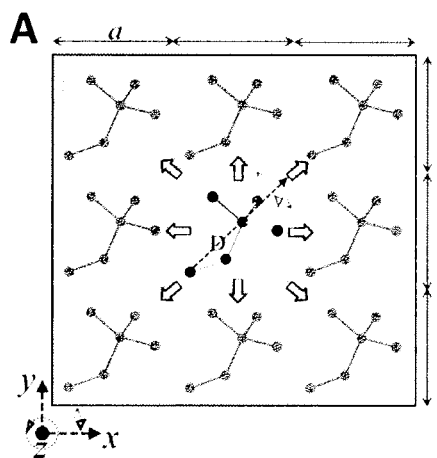
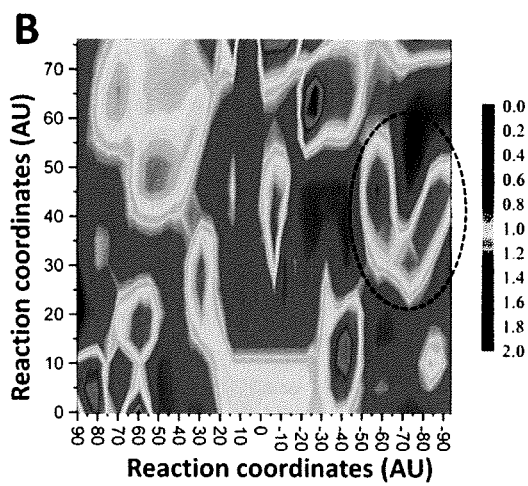
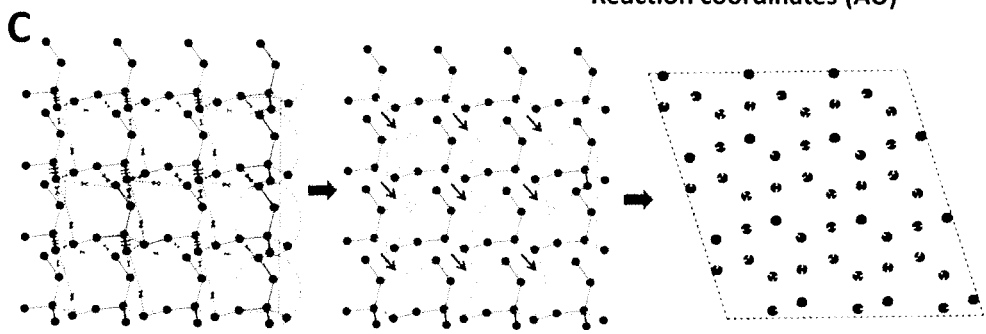
Figure 6C A 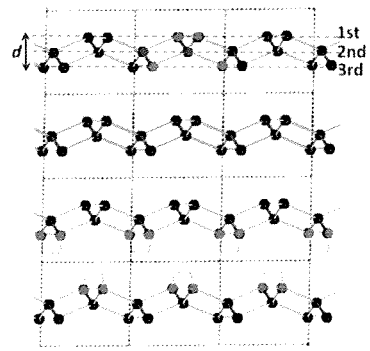   B 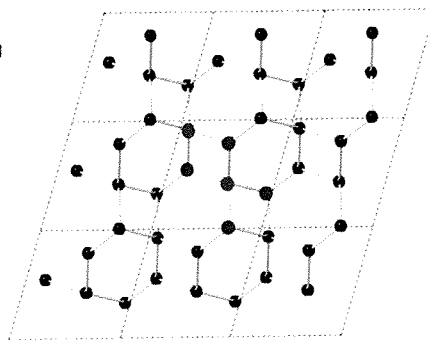
Figure 7A                Figure 7B
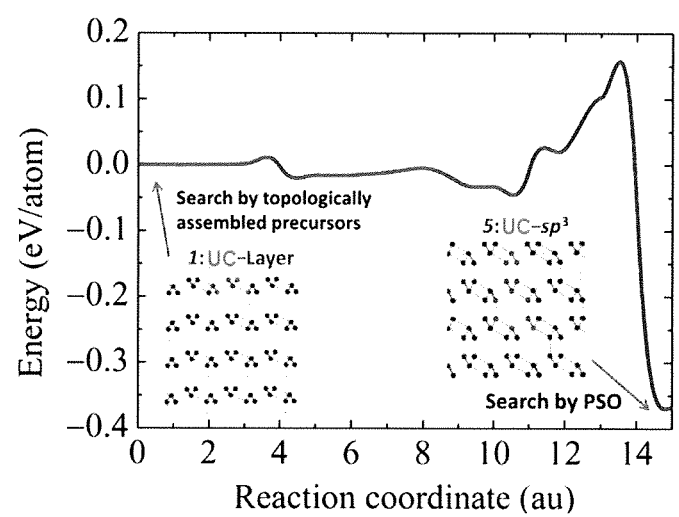
Figure 8

Figure 11A
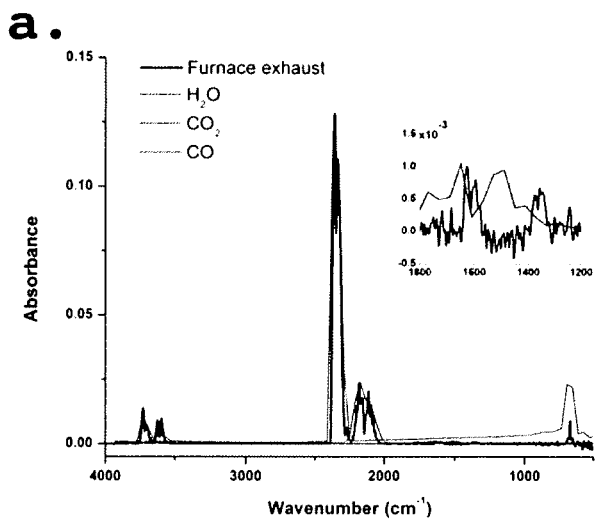
Figure 11B
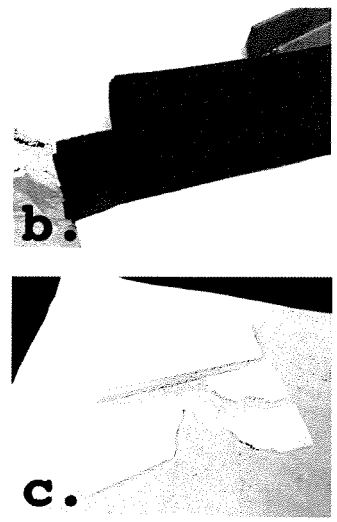
Figure 11C

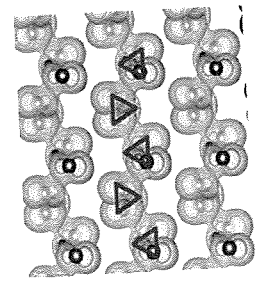
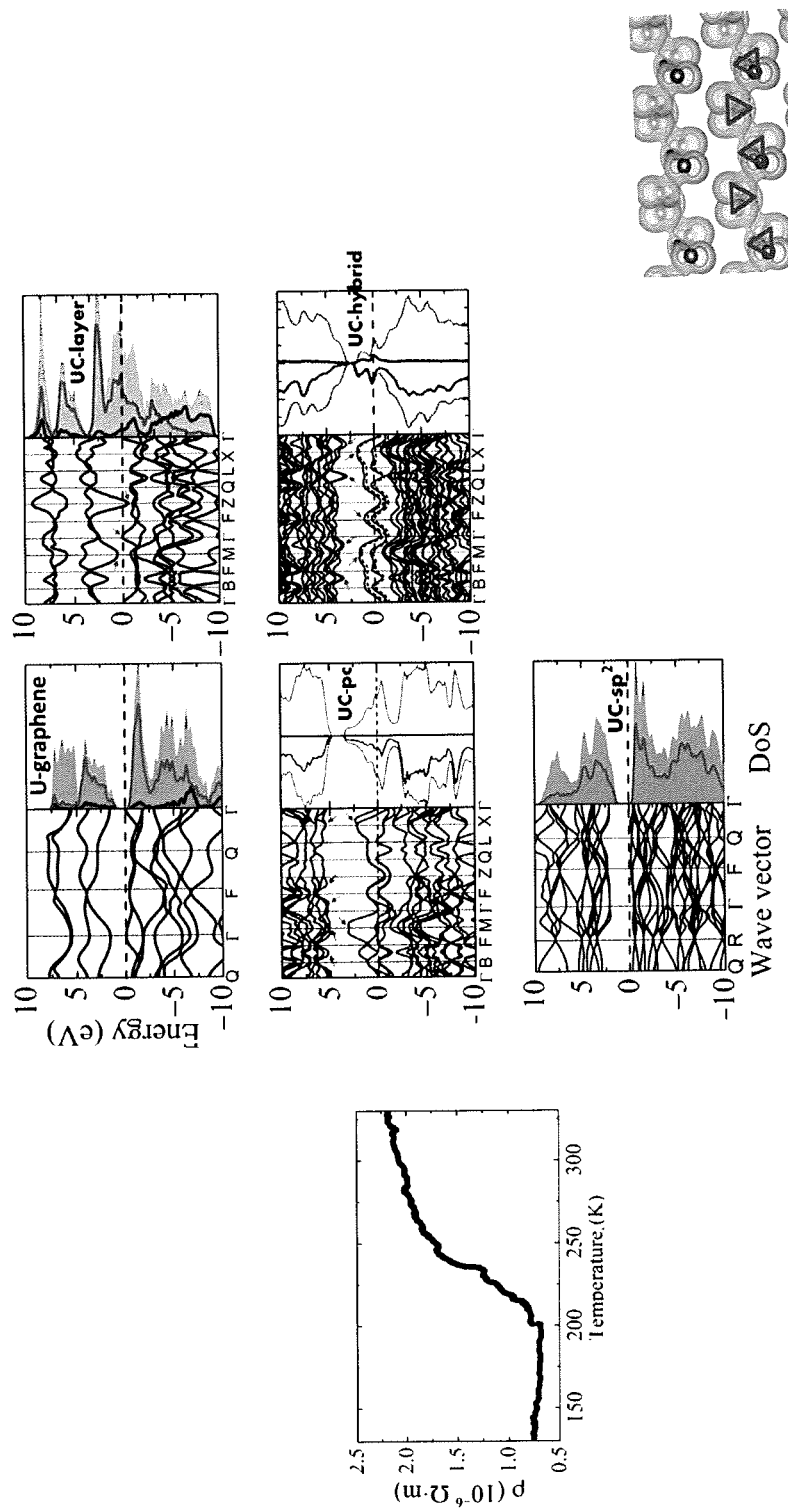
Figure 12C
Figure 12B
Figure 12A

METALLIC AND MAGNETIC CARBON MATERIAL

STATEMENT REGARDING FEDERALLY SPONSORED RESEARCH OR DEVELOPMENT

This invention was made with government support under Grant Number DE-FG02-96ER45579 and DE-AC02-05CH11231 awarded by the Department of Energy (DOE). The government has certain rights in the invention.

BACKGROUND OF THE INVENTION

Field of the Invention

This invention generally relates to a new carbon material. In particular, the invention provides a new metallic and magnetic carbon material, named U-carbon.

State of Technology

Carbon, the building block of life on Earth, is one of the most interesting elements in the Periodic Table. Due to its flexible bonding characteristics that originate from 2s and 2p orbital hybridization, carbon forms over 10 million compounds whose properties are intimately related to their bonding structures categorized by $sp^3$, $sp^2$ and $sp^1$. Among these, diamond and graphite are two of the best-known 3D forms of carbon; the former solely comprised of $sp^3$ bonded carbon is transparent, hard and insulating, while the latter formed of $sp^2$ bonded carbon is black, soft and conducting. The discovery of $C_{60}$, composed of 12 pentagons separated from each other by 20 hexagons, revolutionized carbon science. Since then, new 1D, 2D and 3D carbon allotropes have been discovered and their ever-growing applications pertain to nearly all-important aspects of electronics, energy, and other industries.

However, for decades, the discovery, and especially the synthesis, of 3D metallic and magnetic carbon materials that are stable under ambient conditions has been elusive. It is well known that diamond is electrically insulating despite its unique mechanical strength. The electronic conductivity ($\sim 3 \times 10^5$ S/m) of graphite in its basal plane comes from the graphene layer with zero density of states at the Fermi level. A similar case is found in the bundle of armchair nanotubes, where the conductivity is only from the isolated 1D nanotube along the bundle axis. A cubic phase of carbon formed under 3 Tera-Pascal ($3 \times 10^{12}$ Pa) was reported to be metallic but loses its stability when the pressure is removed. So far, no known pristine carbon materials, including the above mentioned, are magnetic. Some amorphous carbon materials can be magnetic, probably due to the dangling bonds in the glassy structure yet show very limited conductivity ($\sim 2 \times 10^3$ S/m). It would be highly advantageous to have available a form of carbon, stable under ambient working conditions, that is both highly conductive and magnetic. Given the light weight and bio-friendly nature of carbon, such material can bring numerous new developments and applications in science and technologies, especially in the realms of electronics, automotive, and medical sectors.

SUMMARY OF THE INVENTION

Provided herein is a novel metallic, magnetic and mechanically strong 3D carbon material (U-carbon) which exhibits high electrical conductivity and ferromagnetism under ambient conditions. The material comprises a meta-stable $sp^2$-$sp^3$ bonded hybrid system. The specific atomic arrangement makes the resulting material a good electrical conductor and a ferromagnet in a wide temperature range, from well under 0° C. to well above 100° C., including typical working ambient conditions (e.g. at atmospheric pressure and room temperature, and/or pressures and temperatures at which devices usually operate).

Other features and advantages of the present invention will be set forth in the description of invention that follows, and in part will be apparent from the description or may be learned by practice of the invention. The invention will be realized and attained by the compositions and methods particularly pointed out in the written description and claims hereof.

The disclosure provides a 3-dimensional (3-D) U-carbon material comprising one or more pure sp2, pure sp3, and/or sp2-sp3 hybrid crystalline phases, wherein the one or more pure sp2, pure sp3, and/or sp2-sp3 hybrid crystalline phases are formed from buckled sp2-sp3 hybrid layers containing both 4 and 6 membered carbon rings. In some aspects, the buckled sp2-sp3 hybrid layers are stacked within the 3-D U-carbon according to available atomic and/or energetic constraints. In further aspects, the U-carbon material is magnetic and/or electrically conductive. In additional aspects, the 3-D U-carbon material is in the form of a sheet, flake, particle, or granule. In yet further aspects, the 3-D U-carbon material is configured as a magnet, ferromagnet, or magnetic dopant.

Also provided is a 3-D U-carbon material, made by the process of catalyzing a reaction of 3,3-dimethyl-1-butene ($C_6H_{12}$) to form a 3-dimensional material with one or more pure sp2, pure sp3, and/or sp2-sp3 hybrid crystalline phases.

The disclosure also provides a method of making the 3-D U-carbon material described above, comprising depositing a precursor 3,3-dimethyl-1-butene ($C_6H_{12}$) onto a support, and catalyzing a reaction to form the 3-D carbon material. In some aspects, the support is a catalytic substrate or a fiber. In other aspects, the step of depositing is performed via chemical vapor deposition (CVD). In further aspects, the step of depositing is performed at a temperature between 600-1300° C. In yet further aspects, the step of depositing is performed by flowing 3,3-dimethyl-1-butene ($C_6H_{12}$) in an inert carrier gas over the support. In other aspects, the step of depositing is performed in the absence of hydrogen gas input. In additional aspects, the support is a metal or alloy. In additional aspects, the metal is copper, nickel, silver or gold, or an alloy thereof. In further aspects, the support is quartz, metal oxide, silica, boron nitride, silicon dioxide and silicon nitride.

Also provided is a composite material containing the 3-D U-carbon material described above.

Further provisions include an electronic or magnetic component or appliance containing the 3-D U-carbon material described above. In some aspects, what is provided is a device or system comprising the electronic or magnetic component or appliance containing the 3-D U-carbon material.

BRIEF DESCRIPTION OF THE DRAWINGS

FIG. 1A and B. Synthesis of U-carbon (UC). (A) Molecular structure of the precursor 3,3-dimethyl-1-butene ($C_6H_{12}$) used to synthesize UC. (B) Synthesized UC shows a mirror-like appearance with metallic shine.

FIG. 4A-E. (A) The electron energy loss spectrum (EELS) of the annealed UC sample, where the signature of sp$^2$ and sp$^3$ carbon structures are evident. Presented for comparison are the EELS of amorphous carbon, graphite and diamond which are clearly different from that of UC. (B) High-resolution transmission electron microscopy (HRTEM) images (at different length scales) of UC and the electron diffraction patterns that clearly show the crystalline nature of UC. Each electron diffraction pattern corresponds to the TEM image on its left. The identified crystal planes and the corresponding d-spacing values are shown in Table 2. (C) Multiphase Rietveld refinement of the measured XRD of the annealed sample by using the structural models of UC-sp$^2$, UC-sp$^3$ and UC-hybrid. Miller indices are assigned accordingly to the XRD peaks. (D) The TEM image of the local structure obtained by zooming in the images in (B). There is a good match between the TEM image and the simulated one based on the UC-sp$^2$ structure. (E) Local structures from the measured TEM match with the crystal structures of UC-sp$^3$ and UC-hybrid. The detected signals are from the apparently overlapping carbon atoms when looking down the direction perpendicular to the paper. The same structure feature in the TEM image and in the model structure is indicated by the circle.

FIG. 6A-C. Theoretical structure search based on topologically assembled precursors (TAP). (A) A schematic demonstration of the dehydrogenated precursor units assembled in a supercell with fixed configuration determined by the orientation of the precursor unit according to its rotational angle against the x, z and D axis, respectively. (B) Location (circled by dash) of the local minimum in the PES corresponding to the UC-layer structure of U-Carbon. The bar shows the energy/atom against graphite. The axes correspond to the reaction coordinates that measures the orientation of the precursor. (C) The evolution from one topological assembly to the UC-layer structure in planar view. Precursor units in the assembly are highlighted by the circles. During relaxation, one of the C—C bonds in each unit breaks. The breaking of carbon bonds relaxes to the vacancy between units and new sp$^3$ bonded C—C connections are formed.

FIG. 7A and B. (A) The layered structure (UC-layer) found in the computational search of topologically assembled precursor units. Each buckled composite monolayer, named U-graphene, consists of three sublayers of carbon equally separated by ca. d/2=0.65 Å. There are six atoms per unit-cell (indicated by the dotted line) among which four are sp$^2$ and two are sp$^3$ carbon. The sp$^2$ carbon atoms are exposed with a staggered arrangement (flagged by brackets) between the layers. (B) The planar view of U-graphene comprised of equal numbers of four- and six-membered rings.

FIG. 8. Structural search using the TAP method compared to the search based on individual atoms and the unbiased global method with particle swarm optimization (PSO). By matching the XRD, the former method yields the high-energy UC-layer in the PES, corresponding to the starting point of the transition potential profile. The latter finds the UC-sp$^3$ structure corresponding to the end point of the potential profile.

FIG. 11A-C. FTIR spectrum of combustion gases released during controlled burning of U-Carbon. (A) The spectrum shown is superimposed on reference spectra for water, carbon dioxide and carbon monoxide. There is a clear match between the spectrum collected and the $CO_2$ and CO spectra. Water, on the other hand is not detectable within the limits of the FTIR system. Water has a characteristic set of absorption peaks between 1400 and 1800 $cm^{-1}$. Very faint peaks are noted around this range (inset). However, they are not in the locations associated with water. These peaks do match up with nitrogen oxides, which is not unexpected. (B) The sample tested was a stack of alumina felt coated with U-Carbon. This was selected for its high surface area, enabling a significant quantity of carbon to be tested. Note, the felt appears black to the eye but is clearly still metallic in appearance when individual fibers are inspected. (C) After combustion is complete, the alumina felt once again becomes its natural white color.

FIG. 12A-C. (A) Measured temperature-dependent resistivity of the unannealed U-Carbon (UC) sample, showing a negative temperature coefficient up to 200 K, suggesting phonon-mediated conductivity. The conductivity at room temperature ($5 \times 10^5$ S/m) is about twice that of graphite along its basal plane and comparable to that of stainless steel. (B) Calculated electronic bands for various phases in the sample, including U-graphene, UC-layer, UC-bilayer, UC-pc, UC-hybrid, UC-sp3, and UC-sp2. The ragged edges near the Fermi level (dashed line) have multiple extrema (indicated by arrows) at different wave vectors and are contributed by the pz orbitals of the sp2 carbon. UC-hybrid is a spin-polarized system with a net magnetic moment at the Fermi level. (C) Calculated charge density of the valence band maxima and conduction band minima of the UC-layer, which illustrates the pz electrons of the sp2 carbon atoms in a staggered arrangement.

DETAILED DESCRIPTION

Described herein is a novel 3D carbon material that is mechanically strong and exhibits both high electrical conductivity and ferromagnetism. The material is a $sp^2$-$sp^3$ hybrid system which may also include pure sp2 and sp3 phases. The new carbon material, named U-carbon because of its "unusual" structure and properties, has been synthesized using a molecule precursor 3,3-dimethyl-1-butene ($C_6H_{12}$) via the chemical vapor deposition method. Its structure was discovered by matching experimental and theoretical structure searches. Its properties were characterized by first-principles theoretical studies and a variety of experimental measurements.

Definitions

Metastable: A metastable state resides in to a local, rather than the global, minimum in the potential energy surface. A metastable structure of material can stably exist in certain temperature and pressure ranges due to large-enough inter-conversion barriers separating the state from the others. For example, diamond is one metastable state (structure) of carbon.

Unit cell: A "unit cell" is the smallest repetitive unit (with cell parameters and content of atoms) defined for a periodic system (e.g. a crystalline structure).

U-Carbon

Figure 3:
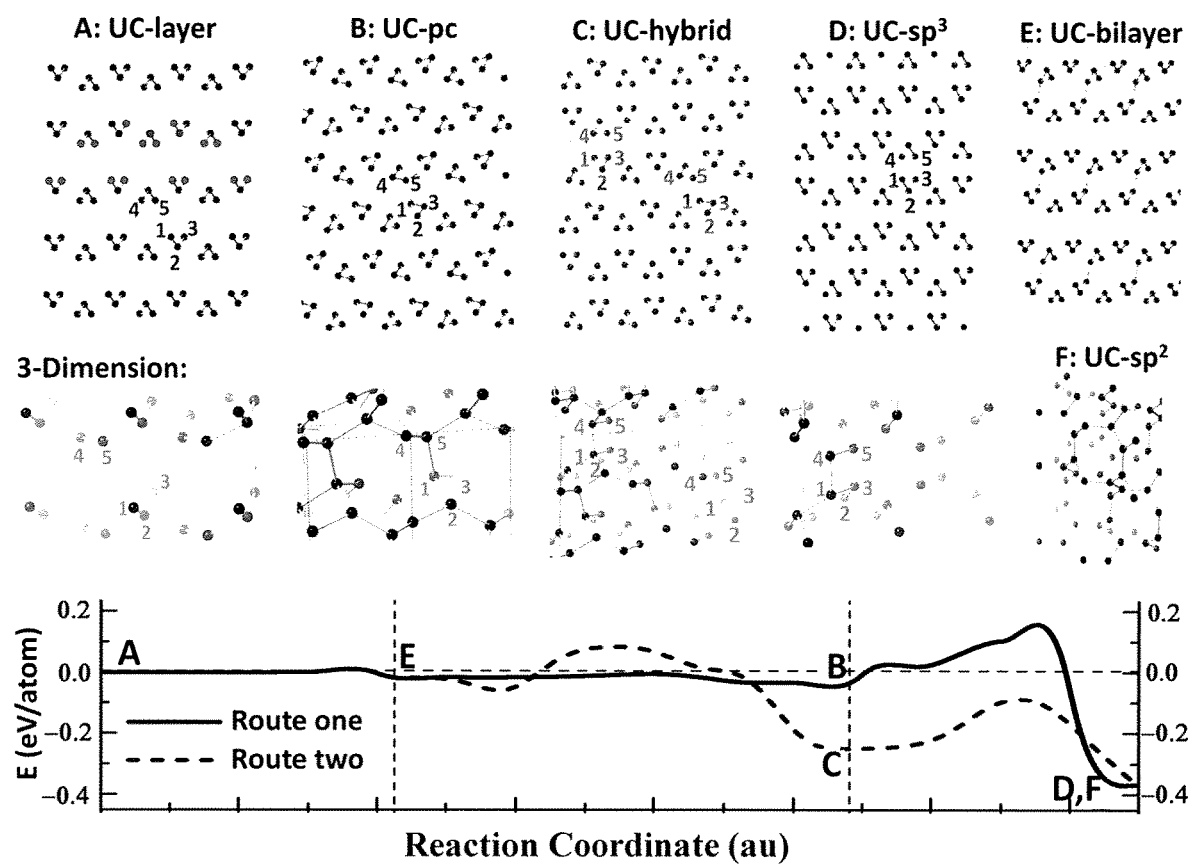
FIG. 3. Structure models for the phases of U-Carbon (UC). These include UC-layer, UC-pc, UC-hybrid, UC-sp$^3$, UC-bilayer and UC-sp$^2$. In the UC-layer structure, the staggered-arranged sp$^2$ carbon atoms in the unit-cell are shown. The corresponding 3D views of the structures are shown with a tilted angle to illustrate the particular arrangement of the carbon atoms in the direction perpendicular to the paper. Note that the visually triangular arrangement of carbon (numbered as 1, 2 and 3) in the 2D view is actually composed of three carbon atoms in different planes parallel to the paper. This special geometrical arrangement is due to the uniquely buckled structure of the composite carbon layer named U-graphene, making the detected signals of the carbon atoms (1, 2 and 3 alike) overlap with each other. Transitions between these phases are due to the relative sliding and approaching of the neighboring layers, forming new bonds as demonstrated by the connections between the numbered atoms (4 and 5 connecting to 1 and 3). The phases are shown along the calculated potential energy profiles of the two reaction routes. Significant interconversion barriers (~400 meV/atom or above) separate the UC-hybrid, UC-sp$^3$ and UC-sp$^2$ phases from the others.

The carbon material described herein is a 3D crystalline system containing a few energetically and structurally related crystalline phases, or one of these phases as demonstrated in FIG. 3, or phases derived from these phases according to phase transitions. The material can be understood as comprised of bonded layers of carbon. A (theoretical) stand-alone single layer containing 4 and 6 membered rings is depicted schematically in FIGS. 7A and B. When bonded together in a 3-D structure, new bonds are formed between the layers, resulting in pure sp2, pure sp3, and sp2-sp3 hybrid systems (phases) depending on possible stacking configurations. Some phases in U-Carbon are semiconducting while the others are metallic and magnetic. As a whole, U-Carbon is electrically conductive and magnetic.

In other words, 3-dimensional U-Carbon typically contains more than one crystalline phase, including sp2, sp3 and sp2-sp3 hybrid phases. These phases coexist in U-carbon and are related structurally according to different ways of stacking of a "U-graphene" structure. U-graphene is a single layer structure containing 4 and 6 membered carbon rings. This single layer structure is buckled so that it has three sublayers of carbon atoms (two exterior sp2 bonded carbon layers and one interior sp3 bonded carbon layer, FIG. 7). Layers of U-graphene stacked in different ways according to possible atomic and energetic constraints form the several phases that are present in U-carbon. As a result, some of the U-carbon phases are more "layered" in appearance (as shown in FIG. 3), while others are not. For the latter, it is not obvious that they are composed from "layers" of bonded U-graphene. Those of skill in the art will recognize that this is difficult to represent in a two-dimensional drawing.

While the pure sp2 and pure sp3 phases are semiconducting, the sp2-sp3 hybrid phases are metallic and magnetic. Overall, 3-D U-carbon is magnetic and electrically conductive.

Methods of synthesizing/producing U-carbon are described below. After production, U-Carbon samples can be in in the form of sheets, flakes, etc. that are e.g. deposited on surfaces or fibers on which they are initially synthesized, or after they have been removed from the substrate and further processed, e.g. into sheets of a desired size, into forms such as flakes or powders, etc.

The U-Carbon sample shows a high reflectivity from far UV to mid IR, visually having a mirror-like appearance with a metallic shine. The U-Carbon sample is mechanically strong and it is difficult to make a scratch at its surface. The sample is pure pristine carbon containing no left-over hydrogens or other chemical elements.

According to different experimental settings controlled during the synthesis, the U-Carbon sample can exhibit electrical conductivities in the orders of about $10^4$ to $10^5$ S/m, comparable to those of semiconducting to metallic substances.

The U-Carbon sample is magnetic. The strength of the magnetization of U-carbon is higher than about 2.0 emu/g with an ordered temperature (of the magnetic spin) higher than about 400K (~125° C.).

Methods of Synthesizing U-Carbon

U-Carbon or composite substances/materials containing U-Carbon or any of its structures of any size or scale may be synthesized using a chemical vapor deposition (CVD) method. Methods involving the deposition and growth of the product on a substrate or fibers or any other forms of support or surface are encompassed in this disclosure. In other aspects, U-Carbon or composite substances/materials containing U-Carbon or any of its structures of any size scale may be synthesized using methods involving solutions (e.g. by crystal growth), where two or more reactants are reacted in the solution to finally produce the product; or, U-Carbon or composite substances/materials containing U-Carbon or any of its structures of any size or scale may be synthesized using methods involving reactants by mixing solid forms of the reactants and reacting the same to produce the product. Any method that results in production of U-carbon material having the atomic arrangements and/or structural configurations present in U-Carbon as described herein, or any of its structures as described herein, regardless of the atomic species of reactants or products involved, is encompassed by this disclosure.

In some aspects, the method used to synthesize or "grow" U-Carbon is a chemical vapor deposition (CVD) method, for example, a "hot-wall" CVD method. CVD is a vacuum deposition method used to produce high quality, high-performance, solid materials. For example, the process is often used in the semiconductor industry to produce thin films. Generally, a substrate (e.g. a wafer for semiconductor manufacture) is exposed to at least one volatile precursor which reacts on the substrate surface to produce the desired deposit. If unwanted volatile by-products are also produced, they are removed by gas flow (e.g. the flow of a carrier gas that carries the precursor) through the reaction chamber.

For the growth of U-Carbon by CVD, the furnace tube is generally maintained at a constant temperature between 700-1000° C., for example, about 700, 800, 900 or 1000° C., Typically, the temperature is about 800° C. The pressure within the CVD system is generally maintained in the range of from about 0.5-2.0 psi (e.g. about 0.5, 1.0, 1.5 or 2.0 psi) above atmospheric pressure e.g. via a flow control valve. The precursor hydrocarbon (3,3-dimethyl-1-butene) is introduced into the furnace tube once the system reached the desired temperature, e.g. by bubbling a carrier gas through a vial of the precursor liquid upstream of the furnace tube. The carrier gas is typically an inert gas, examples of which include but are not limited to: argon. It is noted that hydrogen (gas) is not used in this process to suppress hydrocarbon cracking reactions, which would result in the unwanted formation of a carbon radical site on the molecule followed by bonding to the solid carbon. Growth is performed until the precursor is entirely consumed, and those of skill in the art will recognize that the amount of U-Carbon that is made can thus be varied by varying the amount of precursor that is made available.

In some aspects, a cold trap is provided, e.g. near the outlet of the CVD system to lessen or eliminate side-reactions in or near the hot zone. Such side-reactions can result in production of unwanted reactive radicals, polycyclic aromatic hydrocarbons, etc. and the trap eliminates or lessens their production.

In some aspects, the growth of U-Carbon is dependent on the presence of a catalyst surface (e.g. of a support or substrate or fibers formed from a material that permits or fosters the growth of U-carbon). A variety of materials can serve as suitable catalysts for growth. In some aspects, the catalysts are certain metals or metal oxides, including but not limited to copper, nickel, gold, silver, alloys, etc. It is noted that the growth can also be supported by boron nitride and silicon oxide and nitride. In contrast, un-oxidized silicon and glassy carbon do not show film growth. In addition, it is noted that U-Carbon does not appear to be self-limiting in terms of film thickness. In some aspects, the U-carbon film is deposited on e.g. silicon wafers or quartz plates. A support or substrate or fibers may be formed entirely from a suitable catalytic material or the surface of the support or substrate or fibers on which U-carbon is grown may be coated with or have a layer of the catalytic material available for the deposition of U-carbon.

Carbon deposition and growth continue until the precursor is exhausted, and/or until a desired film thickness is attained. Those of skill in the art will recognize that the amount of precursor that is made available can be varied to accord with the amount of U-Carbon that is desired, e.g. calculated by the desired surface area and/or thickness.

As initially deposited, U-Carbon is generally in the form of a film or sheet (e.g. on a substrate). However, other forms of U-Carbon, e.g. synthesized in solution environments, or deposited on fibers or other supports, or dissociated from the substrate, are also contemplated and encompassed by this disclosure, examples of which include but are not limited to: unsupported films or sheets, flakes, powders, granules, other forms of bulk produced by solution methods or pressing U-Carbon powders or granules, or composite materials made from U-Carbon, etc.

Applications and Uses of U-Carbon

Due to its electrical and magnetic properties as well as the lightweight and bio-friendly nature of carbon, potential applications of U-Carbon are many, such as in electronics, magnetic components, energy devices and medical appliances, and systems comprising those devices. Those of skill in the art will recognize that a material like U-Carbon can have an extremely wide and growing variety of applications and uses, and any device which incorporates at least one U-Carbon as described herein is encompassed by the present disclosure. Examples of uses for U-Carbon include but are not limited to: microprocessor chips and transistors, any device that is computerized or electromagnetic related; devices/appliances with electronic/magnetic components, such as computers, tablets, smartphones, various energy-related technologies (e.g. battery systems and solar cells), touch screens, various types of wearable devices, solar cells, components of illumination devices, and mobile/shipping/flight vehicles, and systems comprising these components.

Especially, the magnetic properties of U-carbon, i.e. it functions as a permanent magnet, a ferromagnet, or a magnetic component/dopant permit its use as (but not limited to) electromagnets, electric motors, generators, transformers, and magnetic storage (e.g., tape recorders and hard disks).

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise. In addition, unless otherwise indicated, numbers expressing quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise. In addition, unless otherwise indicated, numbers expressing quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

All patents and publications mentioned in the specification are indicative of the level of those skilled in the art to which the invention pertains. All patents and publications are herein incorporated by reference in their entirety to the same extent as if each individual publication was specifically and individually indicated to be incorporated by reference.

EXAMPLES

Example 1

Many known carbon materials, such as diamond, $C_{60}$ and other fullerenes, as well as graphdiyne, are metastable forms of carbon that readily exist under ambient conditions due to their great kinetic stability, i.e. the interconversion barrier is high enough to prevent them from transitioning to other phases. We hypothesized that new metastable phases could be achieved by limiting the accessible region in the potential energy surface (PES) during synthesis and "forcing" the produced structure into prescribed states. One possible way to realize this is to use selected molecular precursors rather than individual atoms in the formation. Given that the existing bonding structure inside the chosen molecular precursor will encounter an energy cost for any bond breaking and rearrangement, it may be energetically preferable for the precursor to maintain certain original bonding features when forming the metastable structure, especially when the precursor units can form connections with each other in rapid reactions. This, to some extent, would limit the accessible region in the PES and novel carbon phases could form [1-2]. We chose 3,3-dimethyl-1-butene ($C_6H_{12}$) (FIG. 1A) as the molecular precursor with the aim of forming a new metastable $sp^2$-$sp^3$ bonded hybrid system. Samples were synthesized in a hot-wall chemical vapor deposition (CVD) reactor operating at atmospheric pressure and temperatures ranging from 700-1000° C. The precursor 3,3-dimethyl-1-butene ($C_6H_{12}$) was added to the reactor via bubbling argon gas through it, upstream of the reactor. Injection of the precursor is started once the reactor reached the desired temperature for growth (typically 800° C.) and was halted prior to cooling down. Growth was found to be substrate dependent, with metal oxides, copper, nickel, boron nitride and silicon oxide and nitride supporting growth. In contrast, un-oxidized silicon and glassy carbon do not show any indications of film growth.

Thus, the synthesis supports a growth model where the hydrocarbon feedstock does not break down to atomic radicals and retains some of the carbon backbone structure. From the studies of thermal stability of hydrocarbons in the temperature range and flow rates comparable to the current settings of CVD growth, it is known that hexanes will not extensively break down [3-4]. Another key distinction in the CVD synthesis is the lack of hydrogen in the feedstock gas. Hydrocarbon cracking relies on hydrogen binding to the catalyst to lower the barrier energy for the hydrocarbon to undergo scission [5-7]. The lack of large quantities of available hydrogen render such a reaction pathway much less probable. With catalytic cracking suppressed, dehydrogenation becomes the dominant reaction at the catalyst surface [8], resulting in the formation of a carbon radical site on the molecule followed by bonding to the solid carbon.

Figure 2A:
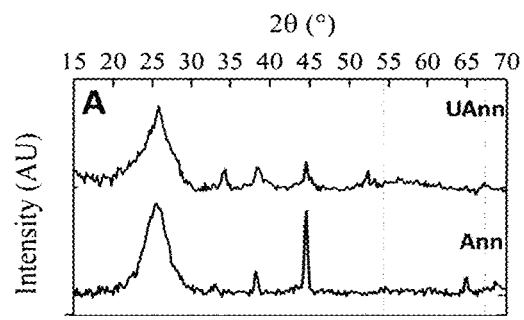
FIG. 2A and B. (A) Measured XRDs for the unannealed sample (UAnn, top line) and annealed sample (Ann, bottom line). (B) Simulated XRDs of the theoretical structures (shown in FIG. 3) are shown for comparison. According to the theoretical model, the unannealed sample is comprised of six crystalline phases that are named UC-layer, UC-bilayer, UC-pc, UC-sp$^2$, UC-sp$^3$, and UC-hybrid. Only a subgroup of the phases, including UC-sp$^2$, UC-sp$^3$ and UC-hybrid, remain in the annealed sample, as suggested by comparing the unannealed XRD to the annealed one, with the major differences around 35°, 45°, 52° and 65°.
Figure 2B:
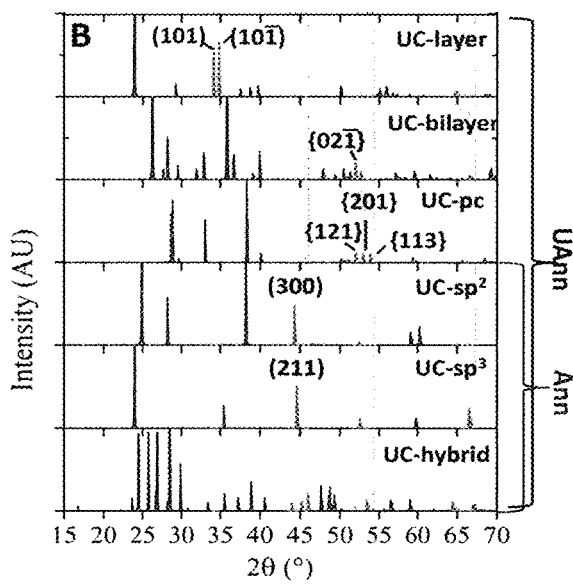
Figure 10:
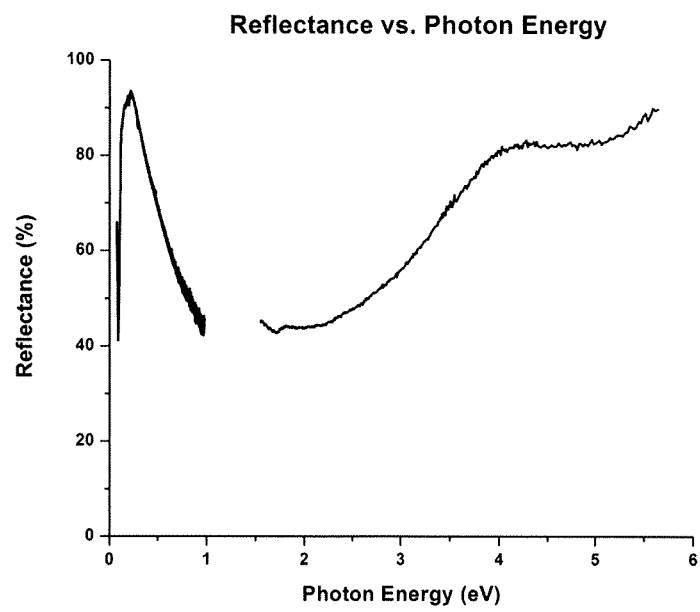
FIG. 10. Reflectance of U-Carbon deposited on a fused silica optical flat. Absolute reflectance was obtained by normalizing the measured reflectance to that of an aluminum mirror. The dips around 1-2.5 eV and below 0.1 eV are consistent with the energy gaps just around the Fermi levels of the U-Carbon structures, as shown in their calculated band structures.

The synthesized carbon material (FIG. 1B), named U-Carbon (UC) because of its unusual structures and properties, shows a high reflectivity from far UV to mid IR (FIG. 10), visually having a mirror-like appearance with a metallic shine. There is no hydrogen left in the sample (FIG. 11), suggesting complete dehydrogenation of the precursor molecules during the synthesis. As shown in FIG. 2A (top curve), the measured XRD exhibits clear and distinctive peaks throughout the region, indicating the crystalline nature of the sample. To find the structure of UC, a comprehensive structure search is conducted and the searched structures are subsequently matched with the experiment using the simulated and the measured XRDs. Once the precursor molecules are dehydrogenated and assembled, new $sp^2$ and $sp^3$ bonds can form according to different connections between the neighboring units.

Possible structures produced by assembling and relaxing the precursor units were investigated by considering the following. First, an assembly of the precursor units should be contained in a cell with certain compactness. There is a distance range, 1-2 Å, for the neighboring carbon atoms to form bonds. The shortest and longest dimensions along the carbon skeleton of the precursor molecule are 1.5 and 3.5 Å, respectively. Therefore, in order to form any C—C bond between the neighboring units, the proper size of the unit cell containing each precursor unit should be in the range of 2.5-5.5 Å. Second, different assembled structures originate from different connectivity between the neighboring precursor units. This is simulated by varying the orientation of the precursor units so that all possible ways of connections between different atomic nodes can be investigated. Thus, a method to search for the possible products is to optimize topologically assembled precursor-units (TAP) defined by different orientations and cell sizes.

The structure search, using the TAP method, resulted in a layered structure (FIG. 3A). Each layer, called U-graphene, is comprised of an equal number of four- and six-membered rings and has a buckled structure with three equally separated (ca. 0.65 Å) sublayers of carbon atoms (FIG. 7). Its primitive unit cell contains six carbon atoms among which two are $sp^3$ and four are $sp^2$ bonded. On the other hand, structures searched by an unbiased global optimization method based on individual atoms resulted in a pure $sp^3$ structure (FIG. 3, structure A).

Figure 9:
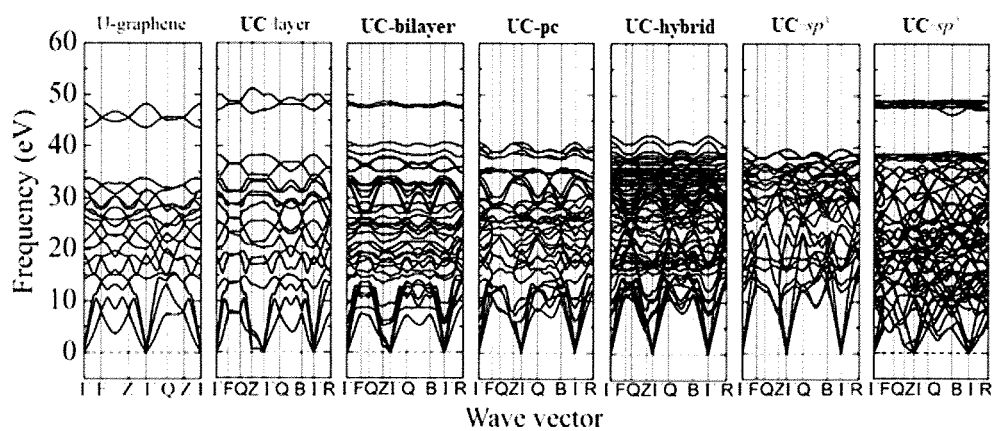
FIG. 9. Calculated phonon spectra of U-graphene and the related structures of U-Carbon, showing that they are all lattice-dynamically stable.

The identified layered structure and the pure $sp^3$ structure are found to be the starting and the end points (FIG. 3 and FIG. 8), respectively, of a group of metastable states that are connected by continuous transitions. Structurally, the layered structure (UC-layer) corresponds to the AA-stacking of the U-graphene with the $sp^2$ carbon atoms exposed outside to the neighboring layers (FIG. 3, structure A). Due to this staggered arrangement of the $sp^2$ carbon atoms and their $p_z$ electrons, the interactions between the layers are weak, with a small exfoliation energy of 0.3 J/m² comparable to that of graphite. As a result, the layers can readily slide against and bind with each other due to the buckled carbon atoms, naturally forming structures according to the possible ways of stacking. These include a mix of AA stacking and ½AB-stacking (UC-bilayer in FIG. 3, structure E), ½AB-stacking (UC-pc in FIG. 3B), a mix of ½AB-stacking and AB-stacking (UC-hybrid in FIG. 3, structure C), and AB-stacking (UC-$sp^3$ in FIG. 3, structure D). Energetically, two reaction routes were identified between UC-layer and UC-$sp^3$ (as shown in the energy profile in FIG. 3). The limited energy barriers suggest that the structures (which are all lattice dynamically stable as shown in FIG. 9) should coexist in the synthesized sample. Further studies on the kinetic stabilities of the phases reveal that there are significant interconversion barriers surrounding the UC-hybrid, UC-$sp^3$ and UC-$sp^2$ phases (FIG. 3). Therefore, it is possible to "purify" these three as a subgroup by pushing the other phases towards UC-$sp^3$ along the energy profile (FIG. 3).

Accordingly, the sample was annealed at 1200° C. under argon followed by cooling to room temperature. The resulting XRD of the annealed sample is given in FIG. 2A (lower curve). Besides the narrowing of peaks upon annealing, four major changes are observed. First, the large peaks between 34°~35° in the unannealed XRD disappear in the annealed one. This is because these peaks originated from the crystal planes (101) and (10$\bar{1}$) of UC-layer which is expected to be removed by annealing. Second, the peak between 44°~45° becomes much more prominent in the annealed XRD since UC-$sp^2$ and UC-$sp^3$ are the only contributors to the peak and their phase fractions are increased by annealing. Third, the peaks between 52°~55° in the unannealed XRD are greatly suppressed in the annealed one, because these peaks are mainly from the crystal planes (02$\bar{1}$) of UC-bilayer as well as (121), (201) and (113) of UC-pc. Both UC-bilayer and UC-pc are expected to be removed by annealing. Fourth, peaks between 64°~67° become more prominent in the annealed sample, since they are mainly contributed by the UC-hybrid and UC-$sp^3$ phases whose fractions are increased upon annealing. Thus, our theory of separating the phases is confirmed by comparing the measured XRDs of the annealed and the unannealed samples, together with the simulated XRDs of the structure models.

The calculated Raman/FTIR active modes agreed well with the measured ones as shown in Table 1, which supports the conclusion arrived from the above analysis of the XRD data.

The electron energy loss spectrum (EELS) in FIG. 4A shows that the annealed sample is a $sp^2$-$sp^3$ hybrid system as expected from the structure models. Note that, unlike the broadened EELS of the amorphous carbon, the EELS of UC exhibit distinct peaks which are different from those of graphite and diamond in terms of both position and relative height (FIG. 4A).

TABLE 1

Measured (Exp.) and calculated (Calc.) Raman and FTIR for U-Carbon. The current theory can only calculate the Raman and IR for materials with bandgaps. Therefore, the metallic UC-hybrid is not included. The eigenvector of each active mode was studied and the corresponding atomic vibration is assigned.

| Spectrum | Exp. (cm$^{-1}$) | Calc. (cm$^{-1}$) | Vibration Assignment |
|---|---|---|---|
| Raman | 1332 | 1318$^a$/1320$^a$ | Breathing & C(sp$^2$)-C(sp$^2$) stretching |
|  |  | 1256$^b$/1259$^b$ | C(sp$^2$)-C(sp$^2$) rotating |
|  | 1582 | 1590$^b$/1592$^b$/1611$^b$ | C(sp$^2$)-C(sp$^2$) stretching |
| IR | 613/729 | 671$^b$/672$^b$ | C(sp$^2$)-C(sp$^2$) rocking |
|  | 1111 | 1059$^a$/1060$^a$/1062$^a$ | C(sp$^3$) vibrating parallel to a-b plane |
|  | 1238 | 1170$^a$/1171$^a$/1173$^a$ | C(sp$^3$) vibrating parallel to a-b |
|  |  | 1191$^b$/1193$^b$ | plane$^a$)C(sp$^2$)-C(sp$^2$) stretching |

$^a$UC-sp$^3$;
$^b$UC-sp$^2$

Next, the sample was investigated via high-resolution transmission electron microscopy (HRTEM) at different length scales (FIG. 4B). The electron diffraction patterns clearly show the crystalline nature of UC. Multiphase Rietveld analysis of the annealed XRD is conducted using the structure models of UC-sp$^2$, UC-sp$^3$ and UC-hybrid (FIG. 4C). The measured lattice parameters are in good agreement with those calculated from first principles, as given in Table 2. The d-spacing values of the peaks in the XRD also match well with the d-spacing measured in the electron diffraction patterns. As shown in FIG. 4C, the first peak between 23°~30° in the XRD contains diffraction peaks from all three phases. It is, therefore, significantly broadened with contributions from the crystal planes (110) and (101) of UC-sp$^2$, (110) of UC-sp$^3$, as well as (11$\overline{1}$), (11$\overline{2}$), (110), (20$\overline{2}$), (003) and (11$\overline{3}$) of the UC-hybrid structure. The two major peaks around 38° and 44° are contributed by UC-sp$^2$ and UC-sp$^3$. Other relatively small yet distinctive peaks around 33°, 65° and 69° are all contributed by the UC-hybrid structure. In addition, our analysis of the XRD and the TEM images indicate that there is no presence of graphite and diamond in UC. The structural features of UC-sp$^2$, UC-sp$^3$ and UC-hybrid have been identified in large areas in the HRTEM images. The data showed good agreement between the experimental TEM image (FIG. 4D) and a simulated one using the UC-sp$^2$ structure. FIG. 4E shows the TEM image that matches the local structures of UC-sp$^3$ and UC-hybrid phases, characterized by fully or partially connected triangular-shaped atomic groups. According to the 3D views of the phases shown in FIG. 3, each atomic group is actually composed of three columns of carbon atoms in different planes parallel to the paper (demonstrated by the numbered atoms in FIG. 3). Such special geometrical arrangement, due to the buckled configuration of U-graphene (FIG. 7), leads to overlapping of the detected signals of the carbon atoms in the same column but on the different planes. Note that UC-hybrid is expected to appear with UC-sp$^3$, since the structure is equivalent to the ½AB-stacking of different sets of UC-sp$^3$ layers (FIG. 3, structure C). Featured by different levels of binding layers, such structure can cause the broadening of the peak around 26° in the XRD, as already mentioned above.

TABLE 2

Lattice parameters of UC-sp$^2$, UC-sp$^3$, and UC-hybrid phases obtained from the Rietveld analysis (RA) compared with those from the density functional theory (DFT) calculations (Calc.). The symmetries of the structures are fixed during the multiphase Rietveld refinement. Non-symmetry-constrained lattice parameters are allowed to vary during the fitting, while the atomic fractional coordinates are fixed. The small relative difference (Δ) between the compared values suggests good agreement between the experiment and the theoretical model.

| Lattice Parameters | UC-sp$^2$ Trigonal: R-3M (166) | | | UC-sp$^3$ Cubic: IM-3M (229) | | | UC-hybrid Monoclinic: C2/M (12) | | |
|---|---|---|---|---|---|---|---|---|---|
|  | RA | Calc. | Δ(%) | RA | Calc. | Δ(%) | RA | Calc. | Δ(%) |
| a (Å) | 6.986 | 7.137 | 2.2 | 4.677 | 4.476 | 4.3 | 6.222 | 6.123 | 1.6 |
| b (Å) | a = b | — |  | a = b = c | — |  | 4.309 | 4.422 | 2.6 |
| c (Å) | 3.604 | 3.607 | 0.1 | α = β = γ = 90 | — |  | 11.317 | 11.717 | 3.5 |
| α (°) | α = β = 90 | — |  |  |  |  | α = γ = 90 | — |  |
| β (°) | γ = 120 | — |  |  |  |  | 127.611 | 127.350 | 0.2 |
| γ(°) |  | — |  |  |  |  | α = γ | — |  |

Figure 5A:
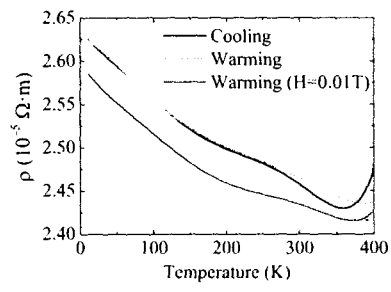
FIG. 5A-I. Electrical transport and magnetic properties of the annealed UC sample. (A) Electrical resistivity of UC measured on cooling and warming as well as in a field of H=0.01 T. The temperature dependence of the resistivity suggests that both holes and electrons are contributing to the conductivity. The reduced resistivity upon applying a magnetic field is characteristic of a ferromagnet in the ordered state. (B) Magnetic susceptibility measured from 2 to 400 K in an applied field of 0.1 T. The splitting between the zero-field cooled data and the field cooled data with H=0.1 T suggests domain formation in the material. (C) Magnetization isotherms measured at 10 and 400 K for fields swept from H=0 to 1.125 T, 1.125 to −1.125 T, and −1.125 to 1.125 T. The saturated magnetization of the sample is about 2.2 emu/g. The inset shows a small hysteresis at 10 K. (D) Magnetoresistance measured at 10, 200, 300, and 400 K in a field perpendicular to the current from −14 to 14 T. The negative magnetoresistance is typical for a ferromagnet in an ordered state. The right panel shows the temperature-dependent Hall coefficient determined from temperature sweeps at H=±14 T. (E) Calculated electronic band structure of UC-sp$^2$ which is semiconducting. (F) Calculated electronic band structure of UC-sp$^3$ which is semiconducting. (G) Calculated electronic band structure of UC-hybrid, showing that the phase is metallic. The solid and dotted lines show the inequality of the two spins around the Fermi level (at zero energy). The second line from the left-most line in the density of states (DoS) shows that the dominant contribution to metallicity comes from the $p_z$ electrons which are also responsible for magnetism. The third line from the left-most line shows the net spin around the Fermi level. (H) The ferromagnetic ground state of the UC-hybrid structure. The arrows show the projected magnetic moments on the carbon atoms. (I) Calculated charge density of the ferromagnetic ground state of UC-hybrid. The arrows indicate the delocalized $p_z$ electrons.

Electrical transport properties of UC are studied by measuring the temperature-dependent resistivity. At room temperature (RT), the unannealed sample can reach an electrical conductivity of 5.0×10$^5$ S/m which is twice that of the graphite in its basal plane and is comparable to that of stainless steel. The temperature dependence (FIG. 12A) has a negative coefficient up until 200 K, suggesting phonon-assisted electronic transitions near the Fermi level. This can be explained by the semi-metallic feature as seen in the calculated electronic bands of the UC-layer and UC-bilayer structures, where the valence band maximum and the conduction band minimum are located at different wave vectors with negligible or negative bandgaps. In addition, parts of the valence bands of the UC-pc and UC-hybrid structures cut through the Fermi level (FIG. 12B) so that both electron and hole carriers will contribute to the conductivity. For the annealed sample, the measured resistivity decreases on cooling from 400 to 375 K before increasing to the lowest measured temperature (FIG. 5A). The RT electrical conductivity is $4.0 \times 10^4$ S/m that is an order of magnitude smaller than that of the unannealed one. This is expected according to the phase movement upon annealing—from the (semi-)metallic phases, including UC-layer, UC-bilayer and UC-pc, towards the semiconducting UC-sp$^2$ and UC-sp$^3$ (FIG. 12B and FIG. 3).

Figure 5B:
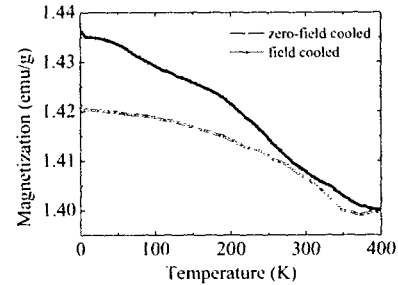
Figure 5C:
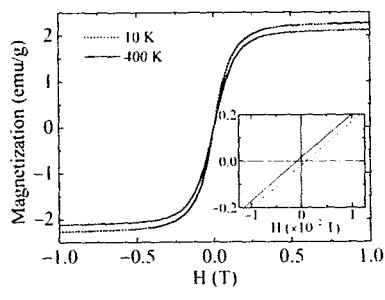
Figure 5D:
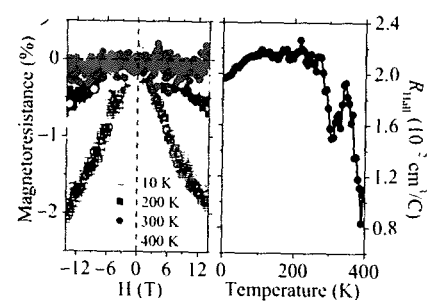
Figure 13:
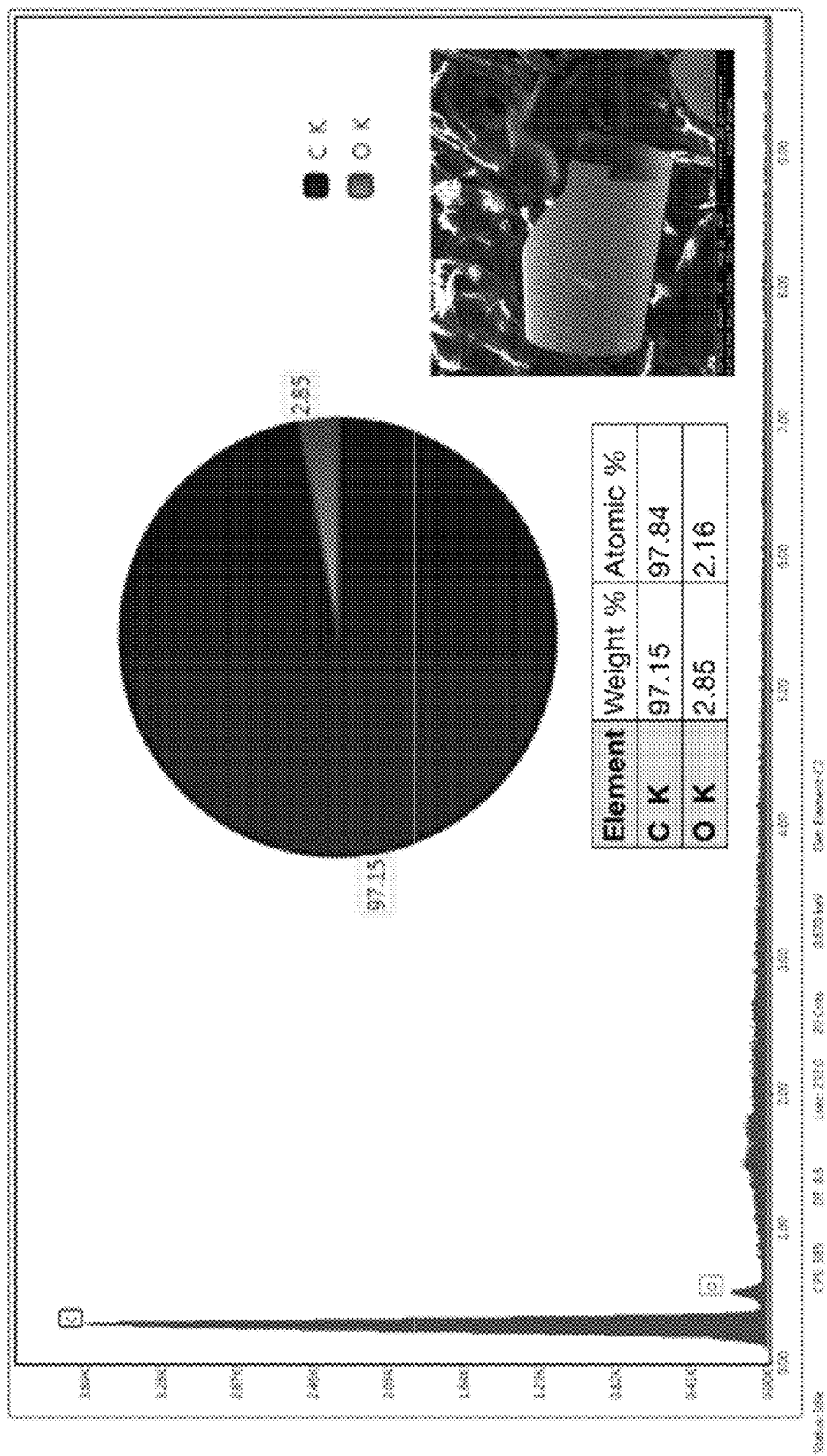
FIG. 13. The surface morphologies (inset) and elemental composition (EDAX) of the UC samples are recorded using FEI Quanta 400 ESEM FEG scanning electron microscope, which showed that the sample is pure carbon with only a trace amount of oxygen coming from the atmosphere, as the sample is placed in micro Torr vacuum during the scan.

UC was found to be intrinsically magnetic under ambient conditions. The magnetic susceptibility M/H of UC was measured on warming from 2 to 400 K and showed a splitting between zero field-cooled and field-cooled (H=0.1 T) data, which is characteristic of domain formations in ferromagnets (FIG. 5B). Magnetic isotherms measured both at 10 and 400 K saturated near 2.2 emu/g with small hysteresis (FIG. 5C and the inset). This suggests that UC is a soft ferromagnet with an ordering temperature above 400 K. To rule out any magnetic contaminant in the sample, ICP-OES tests with a sensitivity down to parts per billion, were performed and the sample was confirmed to be pure without any trace of metal elements, such as Fe, Mn, Ni, Co etc. The surface morphologies and elemental composition (EDAX) of the samples were also recorded and showed that the sample is pure carbon with only a trace amount of oxygen coming from the atmosphere (FIG. 13). Applying a magnetic field of 0.01 T decreased the resistivity of UC (FIG. 5A), leading to a negative magnetoresistance in the entire temperature range, which is characteristic of ferromagnets in the ordered state. The measured magnetoresistance isotherms at 10, 200, 300 and 400 K (FIG. 5D) further validated this. The measured Hall coefficient was positive in the entire temperature range (FIG. 5D), indicating dominant hole-like carriers with a carrier concentration of $3.17 \times 10^{20}$/cm$^3$ at RT.

Figure 5E:
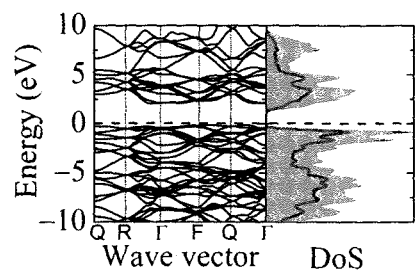
Figure 5F:
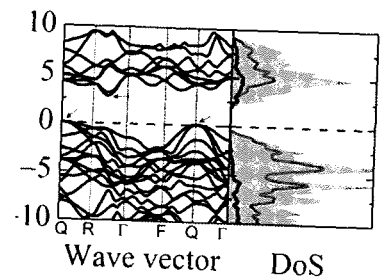
Figure 5G:
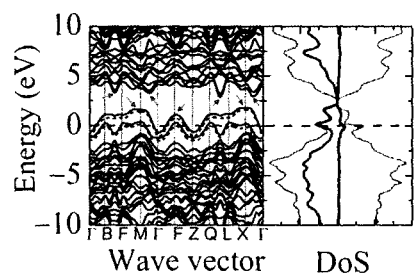
Figure 5H:
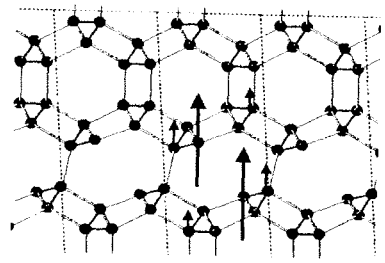
Figure 5I:
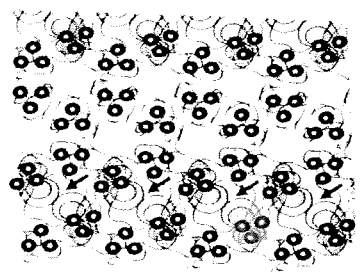

The calculated electronic structures showed that UC-sp$^2$ and UC-sp$^3$ in the annealed sample are semiconducting and non-magnetic (FIG. 5E and FIG. 5F). The UC-hybrid phase, on the other hand, is metallic and has a ferromagnetic ground state with magnetic moment of $0.44\mu_B$ per unit cell (FIG. 5G). The $p_z$ electrons that reside on the sp$^2$ carbon atoms in the UC-hybrid structure (FIG. 5H) are responsible for the metallicity of the phase. They are also the dominant contributors and account for about half of the total magnetic moment, with the remaining half coming from the delocalized electrons in the unit-cell (FIG. 5I). It is worth noting that a pure crystalline carbon structure with ferromagnetism is extremely rare. Before the UC-hybrid structure found here, the only proposed ferromagnetic carbon structure had proven to be unstable [9-10]. This provides yet another confirmation for our theory, since finding a ferromagnetic crystalline carbon structure merely by chance would be highly unlikely. According to the Rietveld analysis (FIG. 4C), the fractions of UC-sp$^2$, UC-sp$^3$ and UC-hybrid in the annealed sample are about 43%, 43% and 14%, respectively. Based on these, the theoretically estimated magnetization of UC is about 3.2 emu/g (see Section 1.1.3 below) which is consistent with the experimentally measured magnetization of 2.2 emu/g (FIG. 5C).

Based on the results above, we have concluded that UC, synthesized by using a specific molecular precursor, occupies a particular region of protected local minima in the PES, which entails its special electrical and magnetic properties originating from a couple of metastable phases. The phases are formed by layers of U-graphene which has a uniquely buckled structure. Each layer has a staggered arrangement of sp$^2$ carbon atoms which can partially or fully bind with the neighboring layers via the $p_z$ electrons (FIG. 17C and FIG. 5I), resulting in structures that exhibit metallic to semiconducting behaviors as well as room-temperature ferromagnetism. The applications of UC and its related structures are many.

REFERENCES

1. H. Prinzbach, F. Wahl, A. Weiler, P. Landenberger, J. Werth, L. T. Scott, M. Gelmont, D. Olevano, F. Sommer, B. von Issendorff, C$_{20}$ carbon cluster: fullerene-boat-sheet generation, mass selection, photoelectron characterization. Chem. Eur. J. 12, 6268-6280 (2006).
2. G. Li, Y. Li, H. Liu, Y. Guo, Y. Li, D. Zhu, Architecture of graphdiyne nanoscale films. Chem. Commun. 46, 3256-3258 (2010).
3. G. Egloff, R. E. Schaad and C. D. Lowry Jr, The decomposition of the paraffin hydrocarbons. J. Phys. Chem., 34, 1617-1740 (2002).
4. L. M. Norton and C. W. Andrews, The Action of Heat on Liquid Paraffins, Am. Chem. J. 8, 1 (1886).
5. B. L. Evering, E. L. d'Ouville, A. P. Lien and R. C. Waugh, Isomerization of Pentanes and Hexanes-Nature and Control of Side Reactions. Industrial & Engineering Chemistry, 45, 582-589 (1953).
6. F. G. Ciapetta and J. Hunter, Isomerization of saturated hydrocarbons in presence of hydrogenation-cracking catalysts: normal hexane. Industrial & Engineering Chemistry, 45, 147-155 (1953).
7. F. Ciapetta and J. Hunter, Isomerization of Saturated Hydrocarbons in Presence of Hydrogenation-Cracking Catalysts: Normal Pentane, Isohexanes, Heptanes, and Octanes. Industrial & Engineering Chemistry, 45, 155-159 (1953).
8. J. J. Sattler, J. Ruiz-Martinez, E. Santillan-Jimenez and B. M. Weckhuysen, Catalytic dehydrogenation of light alkanes on metals and metal oxides. Chemical reviews, 114(20), 10613-10653 (2014).
9. A. A. Ovchinnikov, I. L. Shamovsky, The Structure of the Ferromagnetic Phase of Carbon. J. Mol. Strut. 251, 133-140 (1991).
10. L. Pisani, B. Montanari, N. M. Harrison, Stability of the Ferromagnetic State in a Mixed sp$^2$-sp$^3$ Carbon System. Phys. Rev. B 80, 104415 (2009).
11. G. Kresse, J. Furthmueller, Efficiency of ab-initio total energy calculations for metals and semiconductors using a plane-wave basis set. J. Comput. Mater. Sci. 6, 15-50 (1996).
12. G. Kresse, J. Furthmueller, Efficient iterative schemes for ab initio total-energy calculations using a plane-wave basis set. Phys. Rev. B. 54, 11169-11186 (1996).
13. Y. Wang, J. Lv, L. Zhu, Y. Ma, CALYPSO: A method for crystal structure prediction. Comput. Phys. Commun. 183, 2063 (2012).
14. J. P. Pewdew, K. Burke, M. Ernzerhof, Generalized gradient approximation made simple. Phys. Rev. Lett. 77, 3865 (1996).
15. S. Grimme, Semiempirical GGA-type density functional constructed with a long-range dispersion correction. J. Comput. Chem. 27, 1787 (2006).
16. H. Fang, M. Dove, K. Refson, Ag—Ag dispersive interaction and physical properties of Ag$_3$Co(CN)$_6$. Phys. Rev. B 90, 054302 (2014).
17. D. Sheppard D, P. Xiao, W. Chemelewski, D. D. Johnson, G. Henkelman, A generalized solid-state nudged elastic band method. J. Chem. Phys. 136, 074103 (2012).
18. L. Vocadlo, D. Alfe, M. J. Gillan, I. G. Wood, J. P. Brodholt, G. D. Price, Possible thermal and chemical stabilization of body-centred-cubic iron in the Earth's core. Nature 424, 536 (2003).
19. F. Tran and P. Blaha, Accurate band gaps of semiconductors and insulators with a semilocal exchange-correlation potential. Phys. Rev. Lett. 102, 226401 (2009).
20. S. Ahmed, A. Aitani, F. Rahman, A. Al-Dawood and F. Al-Muhaish, Decomposition of hydrocarbons to hydrogen and carbon. Applied Catalysis A: General, 359, 1-24 (2009).
21. N. Z. Muradov and T. N. Veziroglu, From hydrocarbon to hydrogen-carbon to hydrogen economy. International Journal of Hydrogen Energy, 30, 225-237 (2005).
22. K. C. Hunter and A. L. East, Properties of C—C Bonds in n-Alkanes: relevance to cracking mechanisms. J. Phys. Chem. A, 106, 1346-1356 (2002).
23. C. Koch, Determination of Core Structure Periodicity and Point Defect Density along Dislocations, PhD dissertation, Arizona State University (2002).
24. A. C. Larson and R. B. Von Dreele, Los Alamos National Laboratory Report No. LAUR 86-748 (2000).
25. B. H. Toby, EXPGUI, a graphical user interface for GSAS, J. Appl. Crystallogr. 34, 210 (2001).
26. A. C. Ferrari, Raman spectroscopy of graphene and graphite: disorder, electron-phonon coupling, doping and nonadiabatic effects. Solid State Communications, 143, 47-57 (2007).

While the invention has been described in terms of its preferred embodiments, those skilled in the art will recognize that the invention can be practiced with modification within the spirit and scope of the appended claims. Accordingly, the present invention should not be limited to the embodiments as described above but should further include all modifications and equivalents thereof within the spirit and scope of the description provided herein.

We claim:

1. A carbon material formed from connecting buckled sp2-sp3 hybrid layers with each layer consisting of an equal number of 4 and 6 membered carbon rings, wherein each buckled sp2-sp3 hybrid layer has three equally separated sublayers of carbon atoms containing two exterior sp2 bonded carbon sublayers and one interior sp3 bonded carbon sublayer.

2. The carbon material of claim 1, wherein the carbon material is magnetic.

3. The carbon material of claim 1, wherein the carbon material is electrically conductive.

4. The carbon material of claim 1, in the form of a sheet, flake, particle, or granule.

5. The carbon material of claim 1, configured as a magnet, ferromagnet, or magnetic dopant.

6. A composite material containing the carbon material of claim 1.

7. An electronic or magnetic component or appliance containing the carbon material of claim 1.

8. A device or system comprising the electronic or magnetic component or appliance of claim 7.

* * * * *